(12) United States Patent
Chiu et al.

(10) Patent No.: US 11,640,910 B2
(45) Date of Patent: May 2, 2023

(54) METHOD FOR CUTTING OFF FIN FIELD EFFECT TRANSISTOR

(71) Applicant: SHANGHAI HUALI INTEGRATED CIRCUIT CORPORATION, Shanghai (CN)

(72) Inventors: Yenchan Chiu, Shanghai (CN); Yingju Chen, Shanghai (CN); Liyao Liu, Shanghai (CN); Chanyuan Hu, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 278 days.

(21) Appl. No.: 17/165,806

(22) Filed: Feb. 2, 2021

(65) Prior Publication Data

US 2022/0102154 A1    Mar. 31, 2022

(30) Foreign Application Priority Data

Sep. 30, 2020 (CN) .......................... 202011069653.7

(51) Int. Cl.
*H01L 21/308* (2006.01)
*H01L 21/027* (2006.01)
*H01L 21/306* (2006.01)
*H01L 21/8238* (2006.01)

(52) U.S. Cl.
CPC ...... *H01L 21/3088* (2013.01); *H01L 21/0274* (2013.01); *H01L 21/3081* (2013.01); *H01L 21/3085* (2013.01); *H01L 21/3086* (2013.01); *H01L 21/30604* (2013.01); *H01L 21/823821* (2013.01)

(58) Field of Classification Search
CPC ............. H01L 21/3088; H01L 21/0274; H01L 21/30604; H01L 21/3081; H01L 21/3085; H01L 21/3086; H01L 21/3083; H01L 21/823431; H01L 21/845; H01L 27/0886; H01L 27/0924; H01L 27/10879; H01L 27/1211; H01L 29/66795
See application file for complete search history.

(56) References Cited

U.S. PATENT DOCUMENTS

| 8,753,940 | B1* | 6/2014 | Wei ................. H01L 21/823431 257/E21.429 |
| 9,607,985 | B1* | 3/2017 | Tseng .............. H01L 21/823431 |
| 9,620,380 | B1* | 4/2017 | Dai ..................... H01L 29/6656 |

(Continued)

*Primary Examiner* — Eduardo A Rodela
(74) *Attorney, Agent, or Firm* — Alston & Bird LLP

(57) ABSTRACT

A method for cutting off a fin in a field effect transistor, comprising: step 1: forming fins and first spacing regions, there are two types of fins—the first type is configured to be cut off and a second type is configured to be reserved; and forming a first material layer to fill the first spacing regions; step 2: forming a first pattern structure comprising first strip structures aligning to one first type fin and second spacing regions; step 3: forming second sidewalls on two sides of each first strip structure; step 4: removing the first strip structures to form a second pattern structure by the second sidewalls; step 5: etching away the first material layer and the first type of fins by using the second sidewalls as a mask ; step 6: removing the second sidewalls and the remaining first material layer. The present application enables using less advanced lithography equipment.

17 Claims, 7 Drawing Sheets

(56) References Cited

U.S. PATENT DOCUMENTS

| | | | | |
|---|---|---|---|---|
| 9,853,131 | B1* | 12/2017 | Cheng | H01L 29/1037 |
| 10,109,531 | B1* | 10/2018 | Hsu | H01L 21/76224 |
| 10,361,125 | B2* | 7/2019 | Xu | H01L 29/785 |
| 10,685,838 | B1* | 6/2020 | Shiliang | H01L 21/0276 |
| 10,985,264 | B2* | 4/2021 | Chen | H01L 21/3086 |
| 2013/0277720 | A1* | 10/2013 | Kim | H01L 29/785 |
| | | | | 257/288 |
| 2015/0279971 | A1* | 10/2015 | Xie | H01L 29/66795 |
| | | | | 438/283 |
| 2016/0218010 | A1* | 7/2016 | Lee | H01L 27/1116 |
| 2017/0069504 | A1* | 3/2017 | Li | H01L 21/465 |
| 2017/0170174 | A1* | 6/2017 | Chang | H01L 29/6681 |

* cited by examiner

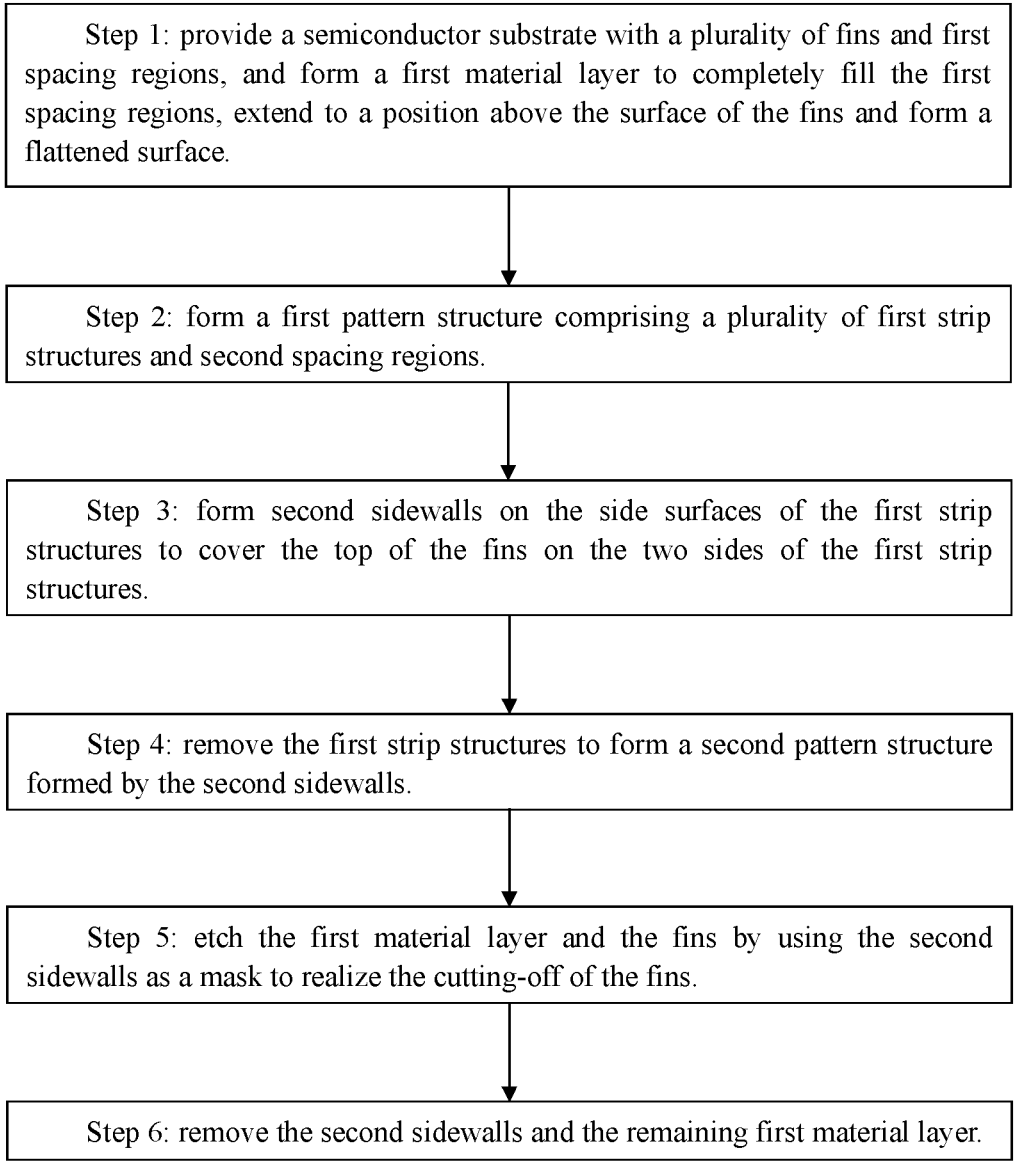

Step 1: provide a semiconductor substrate with a plurality of fins and first spacing regions, and form a first material layer to completely fill the first spacing regions, extend to a position above the surface of the fins and form a flattened surface.

Step 2: form a first pattern structure comprising a plurality of first strip structures and second spacing regions.

Step 3: form second sidewalls on the side surfaces of the first strip structures to cover the top of the fins on the two sides of the first strip structures.

Step 4: remove the first strip structures to form a second pattern structure formed by the second sidewalls.

Step 5: etch the first material layer and the fins by using the second sidewalls as a mask to realize the cutting-off of the fins.

Step 6: remove the second sidewalls and the remaining first material layer.

FIG. 2

METHOD FOR CUTTING OFF FIN FIELD EFFECT TRANSISTOR

CROSS-REFERENCES TO RELATED APPLICATIONS

This application claims priority to Chinese patent application No. CN202011069653.7, filed on Sep. 30, 2020, and entitled "METHOD FOR CUTTING OFF FIN FIELD EFFECT TRANSISTOR", the disclosure of which is incorporated herein by reference in entirety.

TECHNICAL FIELD

The present application relates to the field of semiconductor integrated circuit manufacturing, and in particular, to a method for cutting off a fin field effect transistor (FinFET).

BACKGROUND

Fins are used in fin field effect transistors. By forming gate structures of a transistor on the surface of fins, such as the side surface and top surface, channel width can be increased, thus device performance can be improved. However, on the same semiconductor substrate, gate structures don't need to be formed on all fins, so it is necessary to cut off some of the fins on which the gate structures should not be formed. The existing methods for cutting off fin field effect transistors usually require a photolithography process to cut open those unwanted fins, followed by etching to remove these fins located in the opened region defined by the lithography process. The existing methods have strict requirements on the precision of lithography. With the continuous reduction of the semiconductor IC's process nodes, it has become necessary to adopt a lithography equipment with ever higher lithography precision. However, higher lithography precision demands more advanced lithography equipment, thus higher cost. Moreover, the most advanced lithography equipment often has limited availability, may even be out of reach for many wafer manufacturing fabs. Therefore, it will be very important to use less advanced lithography equipment with lower precision to realize the fin cutting-offs under the situation of continuous reduction of process node.

FIGS. 1A-1C are schematic cross-sectional views of a fin field effect transistor in each step of applying an existing method for cutting off its unwanted fins. The existing method for cutting off unwanted fins in a fin field effect transistor includes the following steps:

In step 1, referring to FIG. 1A, a semiconductor substrate 101 is provided, a plurality of fins 102 are formed on the semiconductor substrate 1, and first spacing regions 103 are formed between two adjacent fins 102.

Usually, the semiconductor substrate 101 is a silicon substrate.

A first hard mask layer 104 is also formed on the top surfaces of the fins 102. As an improvement, the first hard mask layer 104 includes a third oxide layer 104a, a fourth nitride layer 104b and a fifth oxide layer 104c which are superposed.

The fins 102 are formed by patterning the semiconductor substrate 101. For example, a forming region of the fins 102 can be defined through a lithography process, and then the first hard mask layer 104 and the semiconductor substrate 101 are etched to form the fins 102. With the advancement of the process node, the fin width d1 continues to shrink, and the fin width d1 is also known as the Top Critical Dimension (TCD), the fin width d1 is made to be 16 nm in this example of process node of 16 nm.

In step 2, referring to FIG. 1B, a material layer 105 is formed to completely fill the first spacing regions 103 and extend to a location above the hard mask layer 104 and the top surfaces of the fins 102. The material layer 105 may be spin-on-carbon (SOC).

Thereafter, in a lithography process, a photoresist is formed, and light-exposure and resist-development are performed to pattern the photoresist. The photoresist pattern includes photoresist strips 106 and spacing regions between the photoresist strips 106. FIG. 1B shows that the width d2 of each photoresist strip 106 is right above and slightly wider than the one to-be-reserved fin the two sides; the spacing region between two photoresist strips 106 is right above the to-be-cut-off fin. The sum of the width d2 of the photoresist strip 106 and the width of the spacing region between two photoresist strips 106 is width d3. The width d3 is the sum of the widths of two fins 102 and the widths of two first spacing regions 103.

In step 3, referring to FIG. 1C, the material layer 105 and the fins 102 of the opened region are etched away according to lithography definition, to realize cutting-off the unwanted fins 102. Thereafter, the photoresist and the remaining material layer 105 are removed. The cut-off fins are represented separately by reference 102a. Generally, the cut-off fins 102a still have some remaining height d4. For an example, height d4 is about 20 nm in a case of the process node of 16 nm.

The existing method has high requirements on the lithography equipment. At the process node of 16 nm, for example, width d2 is about 53 nm, and width d3 is about 96 nm. In this example, the method can be implemented by applying a less advanced lithography equipment.

However, with further advancement of process node, such as the 14 nm, width d2 will be less than 36 nm, and width d3 will be less than 72 nm. In those cases, less advanced lithography equipment may not be enough.

SUMMARY

The present application provides a method for cutting off a fin during making the field effect transistor, which can reduce the requirement on the lithography capability of a lithography equipment, and can realize exposure by adopting a less advanced lithography equipment.

The method of cutting off a fin during making a field effect transistor comprises a plurality steps:

step 1: providing a semiconductor substrate, wherein the semiconductor substrate comprises a plurality of fins, first spacing regions each formed between two adjacent fins of the plurality of fins; wherein the plurality of fins comprises a first type of fins configured to be cut off in making the field effect transistor and a second type of fins designed to be reserved in making the field effect transistor;

disposing a first material layer to fill the first spacing regions up to a level above top surfaces of the plurality of fins, and planarizing the first material layer;

step 2: forming a first pattern structure on the first material layer, wherein the first pattern structure comprises a plurality of first strip structures and second spacing regions, wherein each of the second spacing regions is placed between two adjacent ones of the plurality of first strip structures; wherein each of the plurality of first strip structures is configured to align to one of the first type of fins and the first spacing regions at two sides of said fin;

wherein each of the second spacing regions is configured to align to one of the first type of fins, two of the second type of fins and the first spacing regions between two adjacent fins;

wherein a sum of a width of one of the plurality of first strip structures and a width of one of the second spacing regions is equal to four times of a sum of a width of one of the plurality of fins and a width of one of the first spacing regions;

step 3: forming second sidewalls on side surfaces of the plurality of first strip structures, wherein the second sidewalls are configured to align to the plurality of fins on two sides of one of the plurality of first strip structures;

step 4: removing the plurality of first strip structures and forming a second pattern structure by the second sidewalls, wherein third spacing regions are formed between two adjacent ones of the second sidewalls;

step 5: removing by etch the first material layer and the first type of fins under the third spacing regions by using the second sidewalls as a mask to realize the cutting-off of the first type of fins; and step 6: removing the second sidewalls and the first material layer.

In some examples, the semiconductor substrate is a silicon substrate.

In some examples, the first material layer in step 1 is disposed by a spin on carbon technique.

In some examples, the first pattern structure in step 2 is formed by adopting further steps: sequentially forming a silicon containing hard mask layer and a photoresist; patterning the photoresist with lithography exposure and development; etching the silicon containing hard mask layer by using the pattern photoresist as a mask to form the first pattern structure; and removing the pattern photoresist.

In some examples, the silicon containing hard mask layer is grown in a temperature range of 200° C.-230° C.

In some examples, before forming the silicon containing hard mask layer, the method further comprises a step of forming a first silicon oxide layer by adopting an atomic layer deposition process; and wherein after the first pattern structure is formed, a surface of the first silicon oxide layer in the second spacing regions is exposed.

In some examples, a temperature range of the atomic layer deposition process for forming the first silicon oxide layer is 60° C.-90° C.

In some examples, in step 3, the step of forming the second sidewalls comprises:

forming a second silicon oxide layer by adopting an atomic layer deposition process, wherein the second silicon dioxide layer covering a top surface and side surfaces of each of the plurality of first strip structures and the surface of the first silicon oxide layer located under the second spacing region; and performing dry etching to remove the second silicon oxide layer on the top surface of the first strip structures, the second sidewalls including the second silicon dioxide layer remaining on the sides of the first strip structures, a stack of the first silicon oxide layer and the second silicon oxide layer on surfaces of the second spacing regions, and wherein each of the second spacing regions have reduced thickness.

In some examples, a temperature range of the atomic layer deposition process for forming the second silicon oxide layer is 60° C.-90° C.

In some examples, in step 4, the first strip structures are removed by adopting a wet etching process.

In some examples, etching solution used in the wet etching process for removing the first strip structures is TMAH.

In some examples, in step 1, a first hard mask layer is also formed on top surfaces of the plurality of fins.

In some examples, the first hard mask layer comprises a third oxide layer, a fourth nitride layer and a fifth oxide layer arranged in a stack.

In some examples, in step 5, a height of one of the first type of fins is less than or equal to 20 nm.

In some examples, a minimum process node of to apply the method to is a fin field effect transistor in a process less than 16 nm.

In some examples, the photoresist exposure is implemented by an immersion lithography equipment.

In some examples, the silicon containing hard mask layer comprises a silicon containing photoresist material.

In the method for cutting off fins during making a field effect transistor provided by the present application, the fins to be cut off are not directly defined by adopting a photolithography process, instead the first pattern structure is defined first, then the fins to be cut off are defined through the second sidewalls formed on the two sides of the first connection structure of the first pattern structure. The dimension of the first pattern structure is larger than the dimension of the second pattern configured by the second sidewalls, so the smaller second pattern structure is not defined through the lithography process, instead is achieved through self-alignment on the basis of the larger first pattern structure. Therefore, the present application can reduce the requirement on the capability of the lithography equipment, and can realize exposure by still applying a less advanced lithography equipment.

BRIEF DESCRIPTION OF THE DRAWINGS

The present application will be further described below in detail in combination with the embodiments with reference to the drawings.

FIG. 2 is a flowchart of a method for cutting off unwanted fins in a field effect transistor according to one embodiment of the present application.

DETAILED DESCRIPTION OF THE APPLICATION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents. The following brief definition of terms shall apply throughout the application:

The term "comprising" means including but not limited to, and should be interpreted in the manner it is typically used in the patent context. The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment). If the specification describes something as "exemplary" or an "example," it should be understood that refers to a non-exclusive example; The terms "about" or "approximately" or the like, when used with a number, may mean that specific number, or alternatively, a range in proximity to the specific number, as understood by persons of skill in the art field.

If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

FIG. 2 is a flowchart depicting a method for cutting off fins in a field effect transistor according to one embodiment of the present application. FIGS. 3A-3G are schematic cross sectional views of a field effect transistor structure after each step in a method for cutting off fins according to one embodiment of the present application.

Figure 3A:
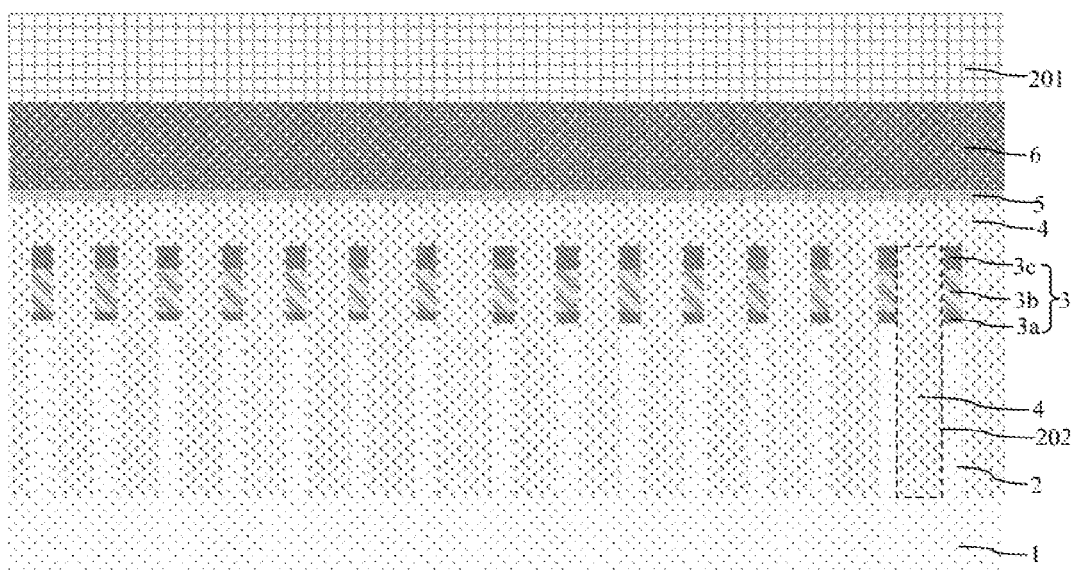
FIGS. 3A-3G are schematic cross sectional views of a field effect transistor structure after each step in a method for cutting off fins according to one embodiment of the present application.

The method for cutting off fins in the field effect transistor according to one embodiment of the present application includes the following steps:

In step 1, referring to FIG. 3A, a semiconductor substrate 1 is provided, a plurality of fins 2 are formed on the semiconductor substrate 1, and first spacing regions 202 are formed between two of the plurality of fins 2.

In the method according to one embodiment of the present application, the semiconductor substrate 1 is a silicon substrate.

A first hard mask layer 3 is also formed on the top surfaces of the fins 2. According to some embodiments, the first hard mask layer 3 includes a third oxide layer 3a, a fourth nitride layer 3b and a fifth oxide layer 3c which are superposed in a stack.

The fins 2 are formed by patterning the semiconductor substrate 1.

A first material layer 4 is disposed on the substrate, the first spacing regions 202 are filled up and above the surface of the first hard mask 3 on the fins 2, followed by planarization. According to some embodiments, the first material layer 4 is disposed by spin-on-carbon technique.

Figure 3B:
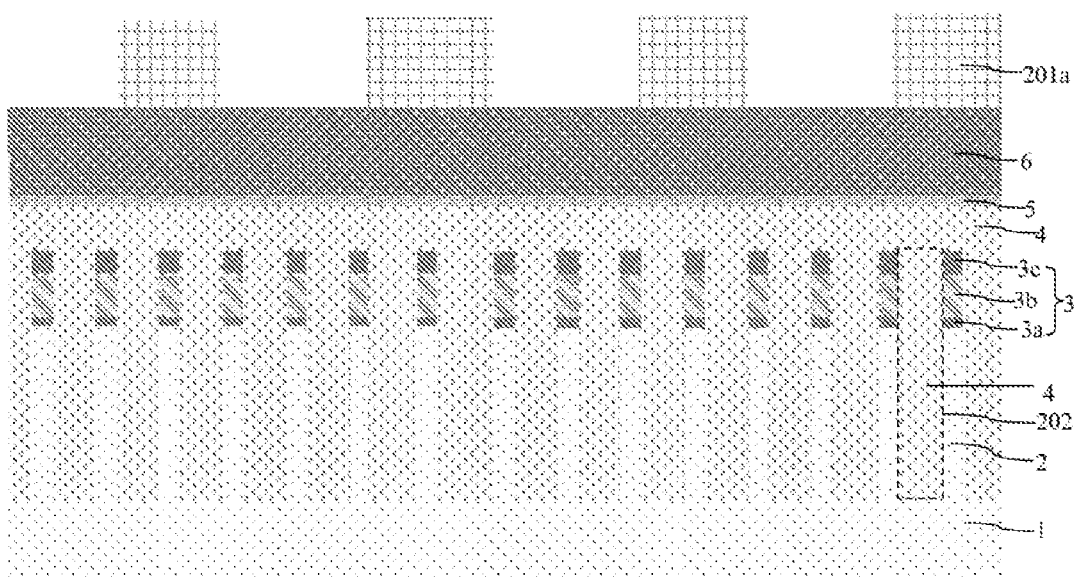
Figure 3C:
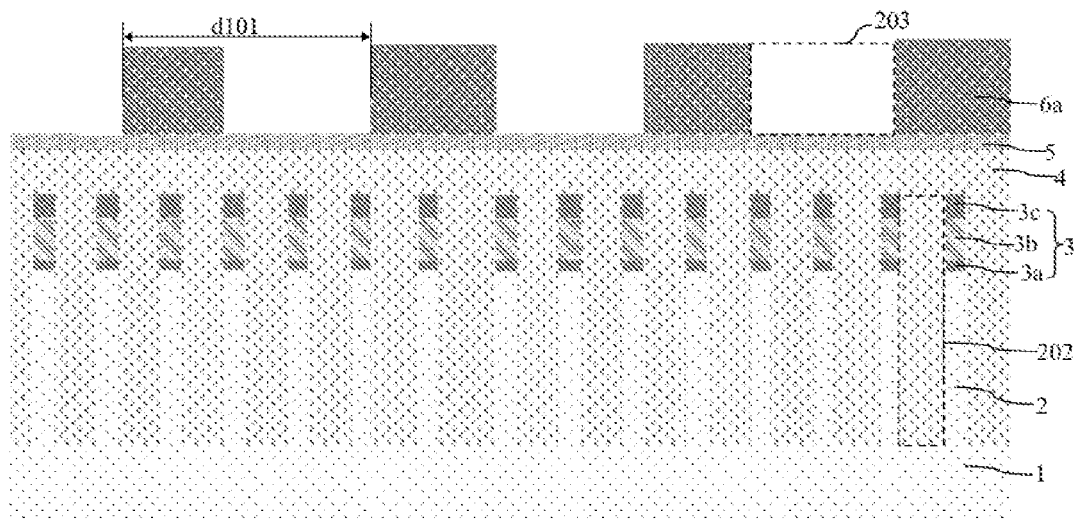

In step 2, referring to FIG. 3C, a first pattern structure is formed on the surface of the first material layer 4, the first pattern structure includes a plurality of first strip structures 6a and second spacing regions 203 between two adjacent ones of the plurality of first strip structures 6a.

Each first strip structure 6a is centered above one of the to-be-cut-off fins 2 and laterally extends into its adjacent first spacing regions 202 at the two sides of the to-be-cut-off fin 2.

A region under the second spacing region 203 includes one to-be-cut-off fin 2, two to-be-reserved fins 2 and the first spacing regions 202.

Figure 1A:
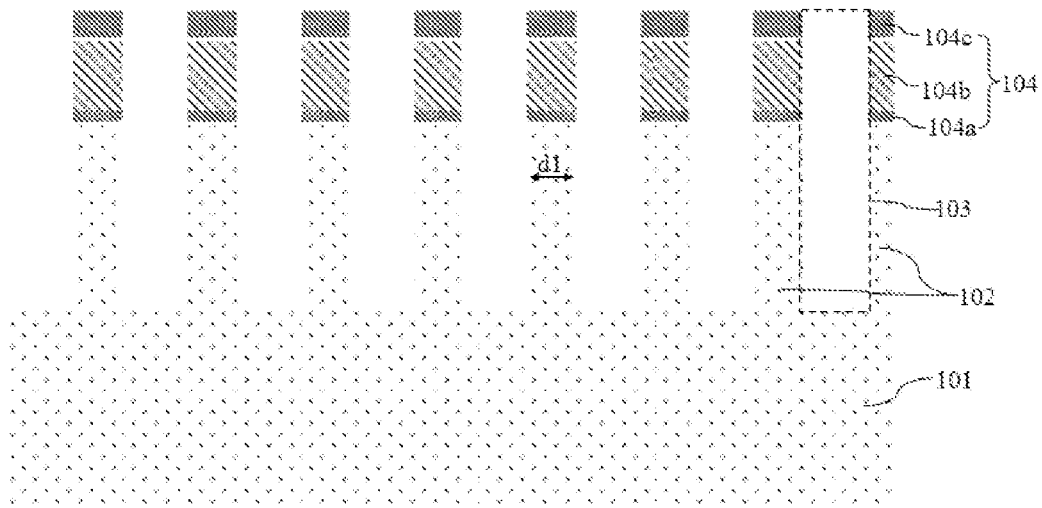
FIGS. 1A-1C are schematic cross sectional views of a gate structure of a field effect transistor after each step in an existing method for cutting off unwanted fins.
Figure 1B:
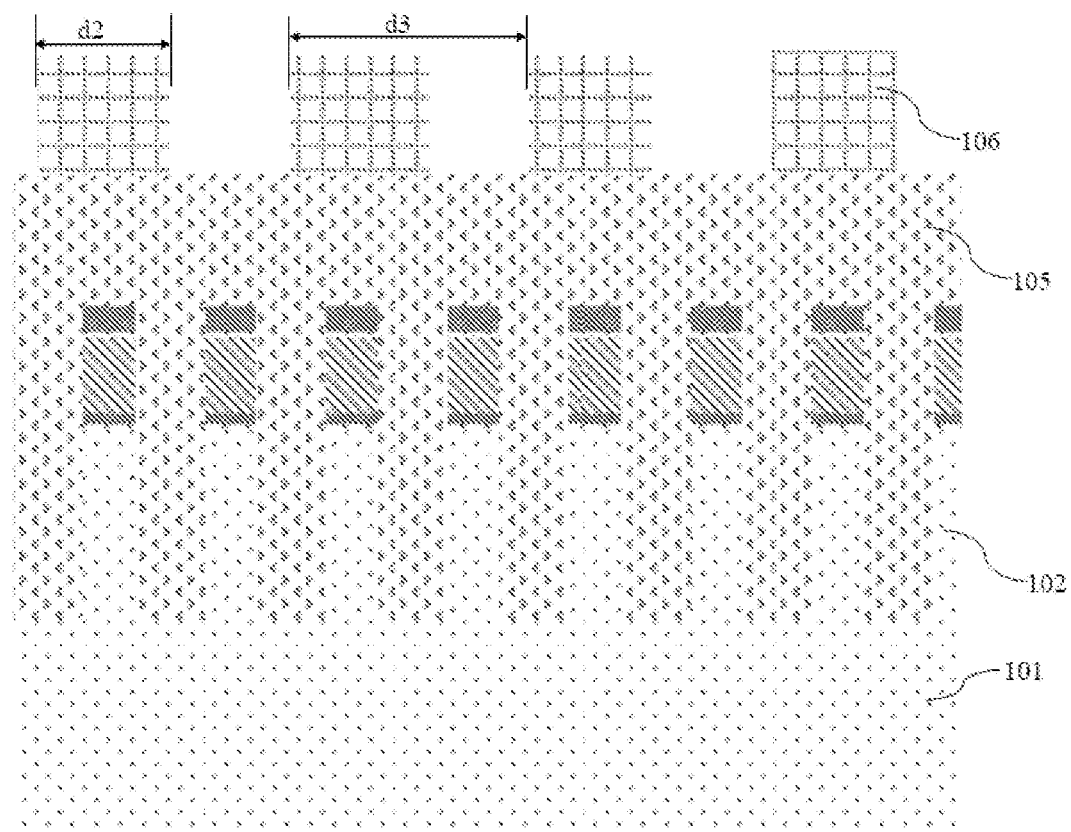
Figure 1C:
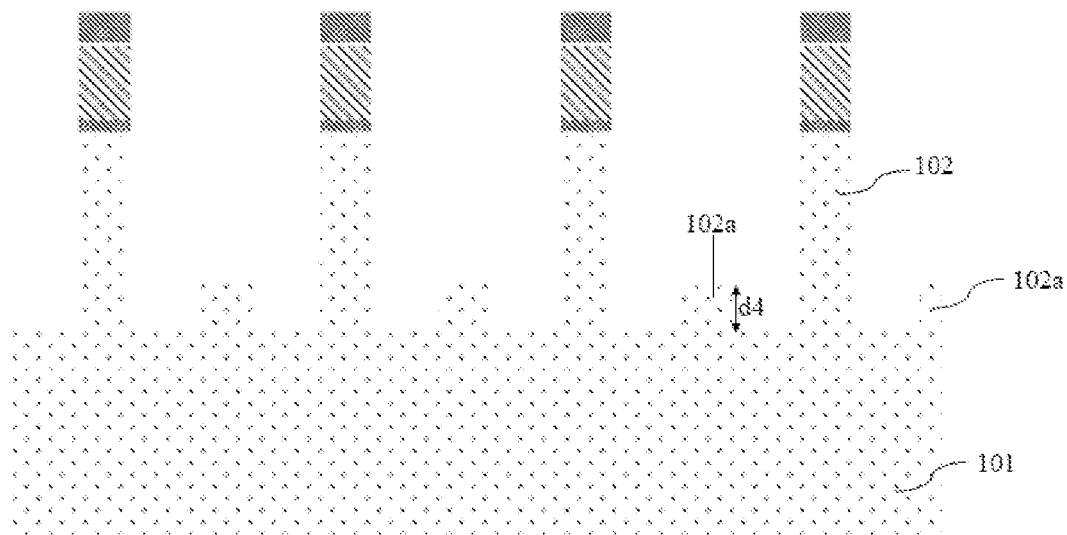

The sum of the width of first strip structure 6a and the width of the second spacing region 203 is equal to four times of the sum of the width of one fin 2 and the width of one first spacing region 202. The sum of the width of the first strip structure 6a and the width of the second spacing region 203 are represented by d101 in FIG. 3C. Compared with the corresponding width d3 in FIG. 1B, the width d101 FIG. 3C in this embodiment is two times the width d3, so it drastically reduces the requirement on the lithography precision for the lithography equipment.

According to the embodiment of the present application, the method forming the first pattern structure comprises the following steps:

Referring to FIG. 3A, a first silicon oxide layer 5, a silicon containing hard mask layer 6 and a photoresist 201 are sequentially formed on the first material layer 4.

The first silicon oxide layer 5 is formed by applying an atomic layer deposition process. According to some embodiments, a low-temperature atomic layer deposition process is applied for forming the first silicon oxide layer 5 in the temperature range of 60° C.-90° C.

The silicon containing hard mask layer 6 has a silicon containing photoresist material.

The growth temperature of the silicon containing hard mask layer 6 is in the range of 200° C.-230° C.

Thereafter, referring to FIG. 3B, exposure and development in a lithography process are performed to the photoresist 201 to pattern a photoresist 201. It can be seen that the photoresist 201 pattern includes a spacing region between two adjacent photoresist strips 201a.

Referring to FIG. 3C, the silicon containing hard mask layer 6 is etched by using the photoresist 201a strips as a mask to form the first pattern structure. The first strip structures 6a include the silicon containing hard mask layer 6 after etching.

The photoresist 201 pattern is removed then.

After the first pattern structure is formed, the surfaces of the first silicon oxide layer 5 in the second spacing regions 203 are exposed.

Figure 3D:
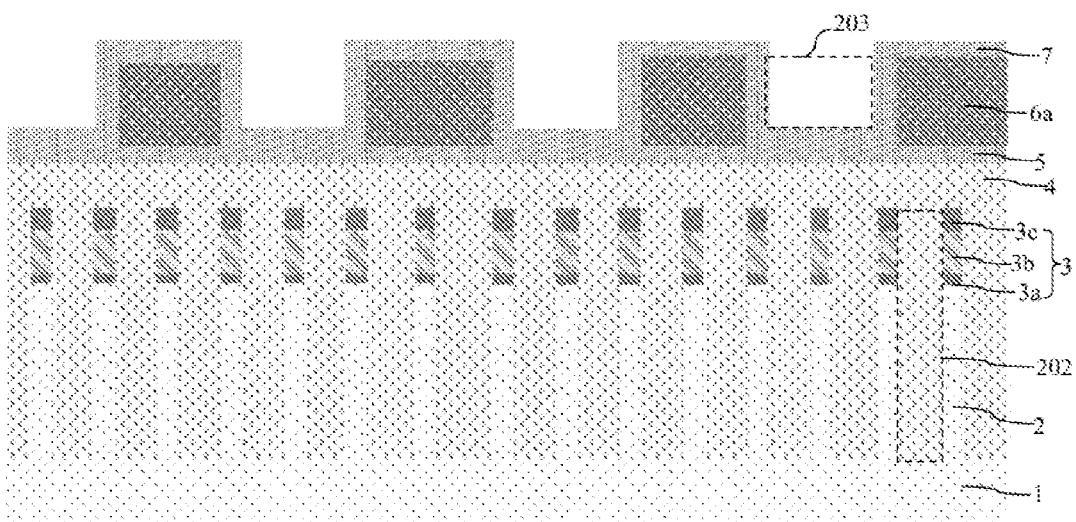
Figure 3E:
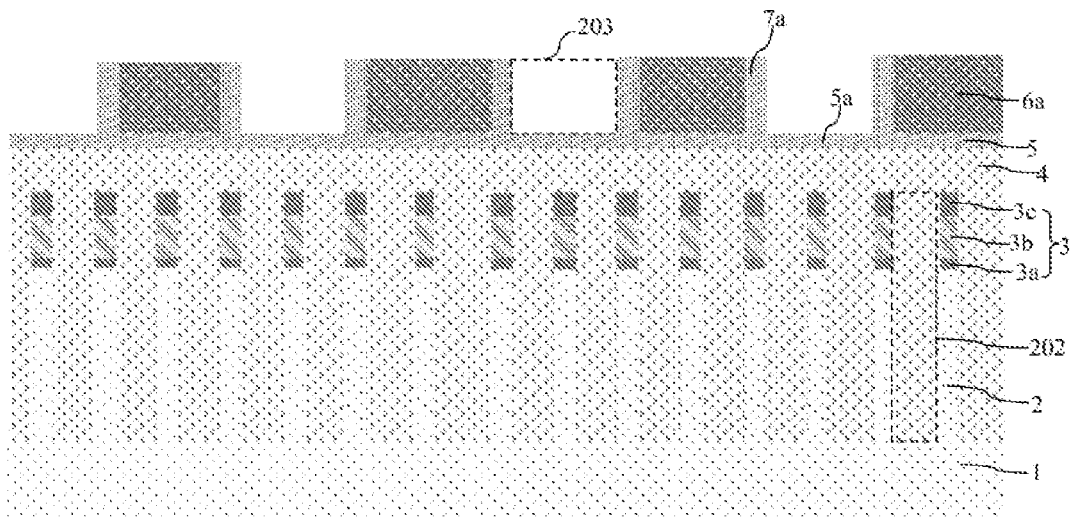

In step 3, referring to FIG. 3E, second sidewalls 7a are formed on the two side surfaces of each of the first strip structures 6a. The second sidewalls 7a are aligned to the top surfaces of some of the fins 2.

In the embodiment of the present application, forming the second sidewalls 7a includes the following steps:

Referring to FIG. 3D, a second silicon oxide layer 7 is formed by adopting an atomic layer deposition process. The second silicon dioxide layer 7 is disposed on the top surface, the side surfaces of each first strip structure 6a, and the exposed surfaces of the first silicon oxide layer 5 within the second spacing regions 203. According to some embodiments, the temperature range of the atomic layer deposition process for forming the second silicon oxide layer 7 is 60° C.-90° C.

Referring to FIG. 3E, dry etching is performed to remove the second silicon oxide layer 7 from the top surfaces of the first strip structures 6a, the second sidewalls includes the second silicon dioxide layer 7a remaining on the sides of the first strip structures 6a, and a stacked structure of the first silicon oxide layer 5. The second silicon oxide layer 7 on the surfaces of the second spacing regions 203 is reduced in its thickness. The post etch stack structure is composed of the first silicon oxide layer 5a and the second silicon oxide layer 7a on the surfaces of the second spacing regions 203.

In FIG. 3E, the width of the second spacing regions 203 will be reduced by an amount of two second sidewalls 7a. Each of the resultant second spacing regions becomes the spacing between the two adjacent second sidewalls 7a.

Figure 3F:
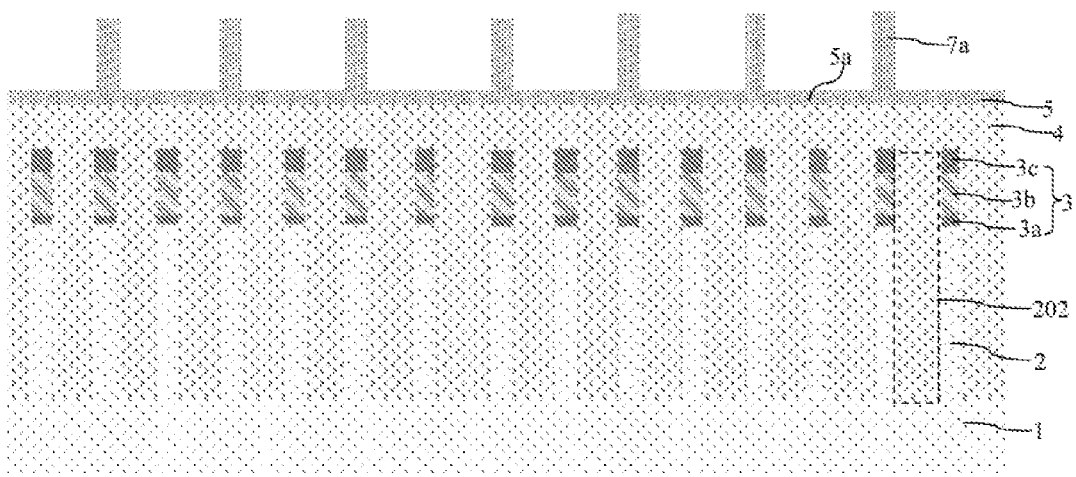

In step 4, referring to FIG. 3F, the first strip structures 6a have been removed and a second pattern structure is formed with the second sidewalls 7a standing, and the third spacing regions are formed between two adjacent second sidewalls 7a.

In FIG. 3F the third spacing regions include the previous remaining second spacing regions 203 and the previous first strip structures 6a.

According to one embodiment of the present application, the first strip structures 6a are removed with a wet etching process.

According to some embodiments, etching solution used in the wet etching process for removing the first strip structures 6a is tetramethylammonium hydroxide (TMAH).

Figure 3G:
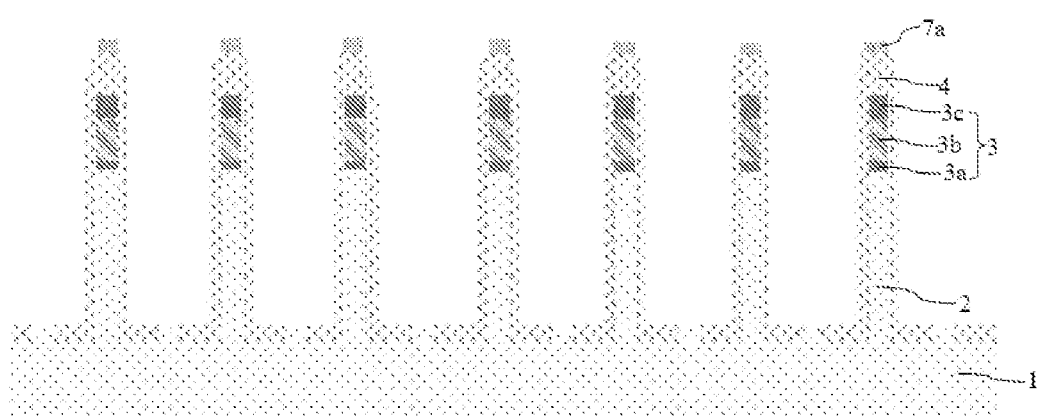

In step 5, referring to FIG. 3G, the first material layer 4 and the unwanted fins under the third spacing regions are etched away by using the second sidewalls 7a as a mask to realize the cutting-off of the unwanted fins 2.

In step 6, the second sidewalls 7a and the remaining first material layer 4 are removed.

The method for cutting off unwanted fins in making a field effect transistor does not define directly those to-be-cut-off fins by adopting a photolithography process, instead the method utilizes three intermediate pattern structures. The first pattern structure is defined first, then to-be-cut-off fins are defined through the second sidewalls 7a formed on the two sides of the first connection structure of the first pattern structure. The dimension of the first pattern structure is larger than the dimension of the second pattern corresponding to the second sidewalls 7a. The dimension of the second pattern structure is smaller than the first but still is not defined through a lithography process, instead it is formed through self-alignment on the basis of the larger first pattern structure. Therefore, the embodiment of the present application can reduce the requirement on the capability of the lithography equipment, therefore able to utilize less advanced lithography equipment. As the result, the process challenge and cost are reduced.

In the current technologies, when the process node is lower than 16 nm, especially critical dimensions are less than 14 nm, the extreme ultraviolet (EUV) lithography equipment has been proposed to perform exposure. By adopting the method provided by the embodiments of the present application, exposure can be realized by applying the less advanced lithography equipment at the process node lower than 16 nm. Since the EUV lithography equipment is more expensive, the invention can greatly reduce the lithography cost.

The present application has been described above in detail through the specific embodiments, which, however, do not constitute limitations to the present application. Without departing from the principle of the present application, those skilled in the art may make many modifications and improvements, which should also be regarded as included in the scope of protection of the present application.

What is claimed is:

1. A method of cutting off a fin in making a field effect transistor comprising a plurality steps:
    step 1: providing a semiconductor substrate, wherein the semiconductor substrate comprises a plurality of fins, first spacing regions each formed between two adjacent fins of the plurality of fins; wherein the plurality of fins comprises a first type of fins designed to be cut off in making the field effect transistor and a second type of fins designed to be reserved in making the field effect transistor;
    disposing a first material layer to fill the first spacing regions up to a level above top surfaces of the plurality of fins, and planarizing the first material layer;
    step 2: forming a first pattern structure on the first material layer, wherein the first pattern structure comprises a plurality of first strip structures and second spacing regions, wherein each of the second spacing regions is placed between two adjacent ones of the plurality of first strip structures;
        wherein each of the plurality of first strip structures is configured to align to one of the first type of fins and the first spacing regions at two sides of said fin;
        wherein each of the second spacing regions is configured to align to one of the first type of fins, two of the second type of fins and the first spacing regions between two adjacent fins;
        wherein a sum of a width of one of the plurality of first strip structures and a width of one of the second spacing regions is equal to four times of a sum of a width of one of the plurality of fins and a width of one of the first spacing regions;
    step 3: forming second sidewalls on side surfaces of the plurality of first strip structures, wherein the second sidewalls are configured to align to the plurality of fins on two sides of one of the plurality of first strip structures;
    step 4: removing the plurality of first strip structures and forming a second pattern structure by the second sidewalls, wherein third spacing regions are formed between two adjacent ones of the second sidewalls;
    step 5: removing by etch the first material layer and the first type of fins under the third spacing regions by using the second sidewalls as a mask to realize the cutting-off of the first type of fins; and
    step 6: removing the second sidewalls and the first material layer.

2. The method of cutting off the fin in making the field effect transistor according to claim 1, wherein the semiconductor substrate is a silicon substrate.

3. The method of cutting off the fin in making the field effect transistor according to claim 1, wherein the first material layer in step 1 is disposed by a spin on carbon technique.

4. The method of cutting off the fin in making the field effect transistor according to claim 3, wherein the first pattern structure in step 2 is formed by adopting further steps:
    sequentially forming a silicon containing hard mask layer and a photoresist;
    patterning the photoresist with lithography exposure and development;
    etching the silicon containing hard mask layer by using the pattern photoresist as a mask to form the first pattern structure; and
    removing the pattern photoresist.

5. The method of cutting off the fin in making the field effect transistor according to claim 4, wherein the silicon containing hard mask layer is grown in a temperature range of 200° C.-230° C.

6. The method of cutting off the fin in making the field effect transistor according to claim 4, wherein before forming the silicon containing hard mask layer, the method further comprises a step of forming a first silicon oxide layer by adopting an atomic layer deposition process; and
    wherein after the first pattern structure is formed, a surface of the first silicon oxide layer in the second spacing regions is exposed.

7. The method of cutting off the fin in making the field effect transistor according to claim 6, wherein a temperature range of the atomic layer deposition process for forming the first silicon oxide layer is 60° C.-90° C.

8. The method of cutting off the fin in making the field effect transistor according to claim 6, wherein in step 3, the step of forming the second sidewalls comprises:

forming a second silicon oxide layer by adopting an atomic layer deposition process, wherein the second silicon dioxide layer covering a top surface and side surfaces of each of the plurality of first strip structures and the surface of the first silicon oxide layer located under the second spacing region; and performing dry etching to remove the second silicon oxide layer on the top surface of the first strip structures, the second sidewalls including the second silicon dioxide layer remaining on the sides of the first strip structures, a stack of the first silicon oxide layer and the second silicon oxide layer on surfaces of the second spacing regions, and wherein each of the second spacing regions have reduced thickness.

9. The method of cutting off the fin in making the field effect transistor according to claim 8, wherein a temperature range of the atomic layer deposition process for forming the second silicon oxide layer is 60° C.-90° C.

10. The method of cutting off the fin in making the field effect transistor according to claim 8, wherein in step 4, the first strip structures are removed by adopting a wet etching process.

11. The method of cutting off the fin in making the field effect transistor according to claim 10, wherein etching solution used in the wet etching process for removing the first strip structures is TMAH.

12. The method of cutting off the fin in making the field effect transistor according to claim 4, wherein a minimum process node of to apply the method to is a fin field effect transistor in a process less than 16 nm.

13. The method of cutting off the fin in making the field effect transistor according to claim 12, wherein the photoresist exposure is implemented by an immersion lithography equipment.

14. The method of cutting off the fin in making the field effect transistor according to claim 4, wherein the silicon containing hard mask layer comprises a silicon containing photoresist material.

15. The method of cutting off the fin in making the field effect transistor according to claim 1, wherein in step 1, a first hard mask layer is also formed on top surfaces of the plurality of fins.

16. The method of cutting off the fin in making the field effect transistor according to claim 15, wherein the first hard mask layer comprises a third oxide layer, a fourth nitride layer and a fifth oxide layer arranged in a stack.

17. The method of cutting off the fin in making the field effect transistor according to claim 1, wherein in step 5, a height of one of the first type of fins is less than or equal to 20 nm.

* * * * *